United States Patent
Rajagopalan et al.

(10) Patent No.: US 7,190,163 B2
(45) Date of Patent: Mar. 13, 2007

(54) METHOD FOR PRODUCING MULTIPLE MR IMAGES WITH DIFFERENT CONTRAST FROM A SINGLE IMAGE ACQUISITION

(75) Inventors: Srinivasan Rajagopalan, Rochester, MN (US); Richard A. Robb, Rochester, MN (US)

(73) Assignee: Mayo Foundation for Medical Education and Research, Rochester, MN (US)

( * ) Notice: Subject to any disclaimer, the term of this patent is extended or adjusted under 35 U.S.C. 154(b) by 123 days.

(21) Appl. No.: 11/063,130

(22) Filed: Feb. 22, 2005

(65) Prior Publication Data

US 2005/0231199 A1   Oct. 20, 2005

Related U.S. Application Data

(60) Provisional application No. 60/561,933, filed on Apr. 14, 2004.

(51) Int. Cl.
*G01V 3/00* (2006.01)

(52) U.S. Cl. .................................. 324/309; 324/307
(58) Field of Classification Search ............... 324/309, 324/307, 306, 300, 318, 322; 600/407, 410, 600/420, 422
See application file for complete search history.

(56) References Cited

U.S. PATENT DOCUMENTS

| 5,727,080 A | * | 3/1998 | Cox et al. ................... 382/168 |
| 6,121,775 A | * | 9/2000 | Pearlman ..................... 324/309 |
| 6,584,216 B1 | | 6/2003 | Nyul et al. |
| 6,597,937 B2 | * | 7/2003 | Liu et al. ..................... 600/420 |

* cited by examiner

*Primary Examiner*—Brij B. Shrivastav
(74) *Attorney, Agent, or Firm*—Quarles & Brady LLP

(57) ABSTRACT

A training module is used to produce a database that stores histogram landmarks for MR images acquired with different scan parameters such as TR, TE flip angle and inversion recovery time. This database is used by a transformation module which enables an MR image acquired at one prescribed set of scan parameters to be transformed into MR images that simulate MR images acquired with different scan parameters.

12 Claims, 9 Drawing Sheets

METHOD FOR PRODUCING MULTIPLE MR IMAGES WITH DIFFERENT CONTRAST FROM A SINGLE IMAGE ACQUISITION

CROSS-REFERENCE TO RELATED APPLICATIONS

This application is based on U.S. Provisional Patent Application Ser. No. 60/561,933 filed on Apr. 14, 2004, and entitled "METHOD FOR PRODUCING MULTIPLE MR IMAGES WITH DIFFERENT CONTRAST FROM A SINGLE IMAGE ACQUISITION".

BACKGROUND OF THE INVENTION

The field of the invention is nuclear magnetic resonance imaging methods and systems. More particularly, the invention relates to the processing of acquired MR images to alter their contrast enhancement characteristics.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, $M_o$, may be rotated, or "tipped", into the x-y plane to produce a net transverse magnetic moment $M_t$. A signal is emitted by the excited spins after the excitation signal $B_1$ is terminated, this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

The practical value of this phenomena resides in the radio signal which is emitted after the excitation signal $B_1$ is terminated. When the excitation signal is removed, an oscillating sine wave is induced in a receiving coil by the rotating field produced by the transverse magnetic moment $M_t$. The frequency of this signal is the Larmor frequency, and its initial amplitude, $A_0$, is determined by the magnitude of the longitudinal magnetization of $M_1$. The amplitude A of the emission signal (in simple systems) decays in an exponential fashion with time, t:

$$A = A_o e^{-t/T_2}$$

The decay constant $1/T_2$ is a characteristic of the process and it provides valuable information about the substance under study. The time constant $T_2$ is referred to as the "spin-spin relaxation" constant, or the "transverse relaxation" constant, and it measures the rate at which the aligned precession of the nuclei diphase after removal of the excitation signal $B_1$.

Other factors contribute to the amplitude of the emission signal which is defined by the $T_2$ spin-spin relaxation process. One of these is referred to as the spin-lattice relaxation process which is characterized by the time constant $T_1$. This is also called the longitudinal relaxation process as it describes the recovery of the net magnetic moment M to its equilibrium value $M_0$ along the axis of magnetic polarization. The $T_1$ time constant is longer than $T_2$, much longer in most substances. Substances can be contrasted in an MR image by the differences in either their $T_1$ or $T_2$ characteristics.

The measurement cycle used to acquire MR data from which an image is reconstructed is usually prescribed to enhance the contrast between tissues by exploiting the differences in $T_1$ or $T_2$ characteristics of those tissues. One such pulse sequence is shown in FIG. 2. This sequence, commonly known as a spin-echo sequence, performs a slice selection by applying a 90° selective RF excitation pulse 30 in the presence of a slice-select gradient pulse 31 and its associated rephrasing pulse 32. After an interval TE/2, a 180° selective RF excitation pulse 33 is applied in the presence of another gradient pulse 34 to refocus the transverse magnetization at the time TE and produce an echo NMR signal 35.

To position encode the echo NMR signal 35, a read-out gradient pulse 36 is applied during the acquisition of the NMR signal 35. The read-out gradient frequency encodes the NMR signal 35 in the well known manner. In addition, the echo NMR signal 35 is position encoded, by a phase encoding gradient pulse 37. The phase encoding gradient pulse 37 has one strength during each echo pulse sequence and associated NMR echo signal 35, and it is typically incremented in steps through a prescribed number of discrete strengths during the entire scan. As a result, each of the NMR echo signals 35 acquired during the scan is uniquely phase encoded.

There are two significant variables in such pulse sequences that affect the $T_1$ and $T_2$ contrast of tissues. These are the echo time TE and the transmit repeat time TR. The TE time is very sensitive to the $T_2$ decay of the NMR signals produced by the subject tissues and its prescribed value is used to contrast between tissues based on $T_2$ differences. The TR time is the interval between repeats of the pulse sequence and its value is very sensitive to the differences in $T_1$ time constants of the tissues being imaged.

The trick is to set the TE and TR of the imaging pulse sequence such that maximum image contrast can be achieved between the tissues of interest. Because scanner time is very valuable, typically the clinician acquires one image with these parameters set to values which are known to produce good contrast between the tissues of interest. For many reasons, the best results are often not achieved and either the clinician makes due with the acquired image or repeats the scan with a different prescribed scan. The latter action is time-consuming and costly.

SUMMARY OF THE INVENTION

The present invention is a method for processing an acquired MR image and producing additional images having tissue contrast characteristics similar to MR images acquired with different scan parameter prescriptions. More particularly salient landmarks in MR images of specific tissues and at different scan parameter prescriptions are stored in a database. These landmarks are then detected in a subsequently acquired MR image of the tissues of interest and these detected landmarks are used in combination with the information in the stored database to transform the acquired image to one or more images of different contrast characteristics. With minimal scanner time and with negligible post-processing time, a set of images can be produced which simulate images acquired at different scan parameter prescriptions.

One aspect of the invention is to produce from a single acquired image of a subject additional images having contrast characteristics similar to images acquired at different TE and TR scan prescriptions. With minimal scanner time, therefore, a set of images can be produced which simulate multiple images acquired at different TR and TE prescriptions.

Another aspect of the invention is the acquisition of MR images in a short scan time without loosing the clinical value of MR images acquired with longer scan times. MR images can be produced in near real time during a medical procedure by using a pulse sequence with a very short TR. Such T1 weighted images are not always clinically optimal and by employing the present invention, one can quickly produce simulated T2 weighted images without the need for a pulse sequence with a long TR and consequent long scan time.

Another aspect of the invention is the determination of the optimal TR/TE prescription for a particular MR scan. In this application a scout scan is quickly acquired with the MRI system and the resulting scout image is transformed to produce a plurality of transformed scout images at a wide range of TR/TE values. From these transformed scout images, the clinician can select the optimal scan parameters for a subsequent MR scan.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims and herein for interpreting the scope of the invention.

DESCRIPTION OF THE PREFERRED EMBODIMENT

Figure 1:
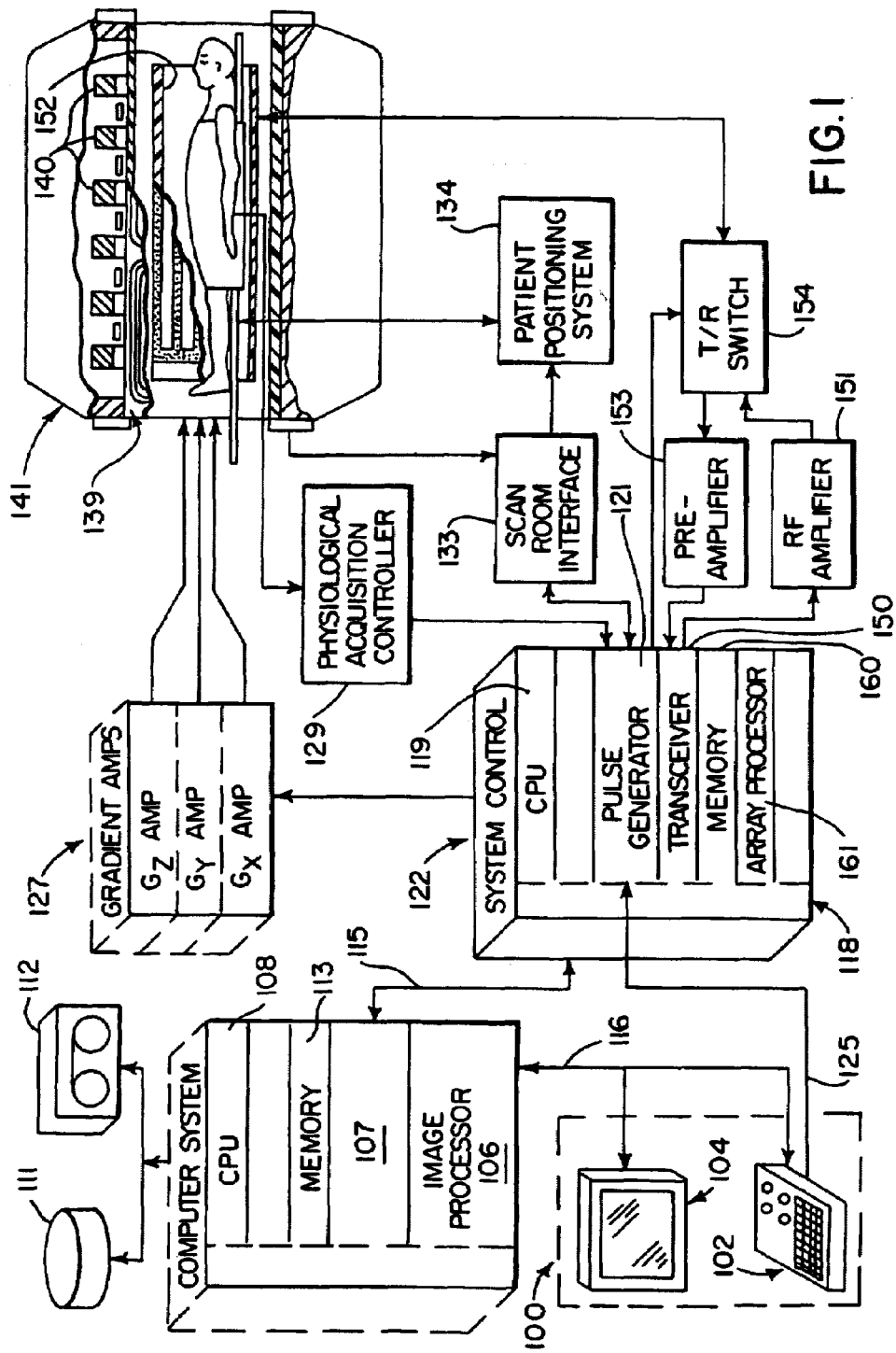
FIG. 1 is a block diagram of an MRI system which employs the present invention.
Figure 2:
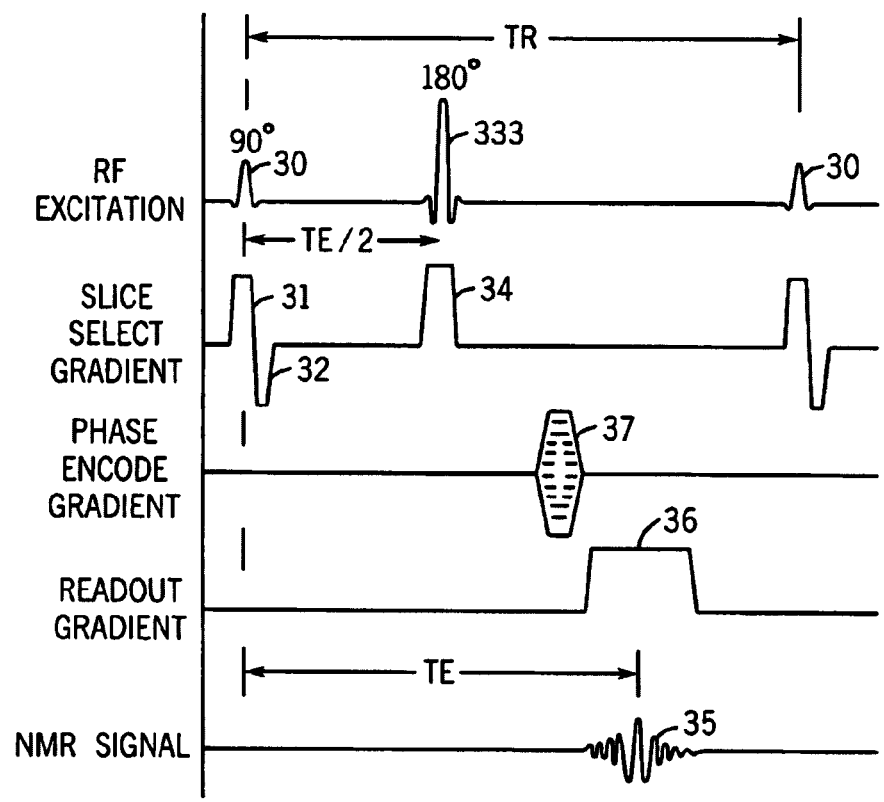
FIG. 2 is an exemplary pulse sequence used by the MRI system of FIG. 1.

Referring first to FIG. 1, there is shown the major components of a preferred MRI system which incorporates the present invention. The operation of the system is controlled from an operator console 100 which includes a keyboard and control panel 102 and a display 104. The console 100 communicates through a link 116 with a separate computer system 107 that enables an operator to control the production and display of images on the screen 104. The computer system 107 includes a number of modules which communicate with each other through a backplane. These include an image processor module 106, a CPU module 108 and a memory module 113, known in the art as a frame buffer for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane. These include a CPU module 119 and a pulse generator module 121 which connects to the operator console 100 through a serial link 125. It is through this link 125 that the system control 122 receives commands from the operator which indicate the scan sequence that is to be performed. The pulse generator module 121 operates the system components to carry out the desired scan sequence. It produces data which indicates the timing, strength and shape of the RF pulses which are to be produced, and the timing of and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from a number of different sensors connected to the patient, such as ECG signals from electrodes or respiratory signals from a bellows. And finally, the pulse generator module 121 connects to a scan room interface circuit 133 which receives signals from various sensors associated with the condition of the patient and the magnet system. It is also through the scan room interface circuit 133 that a patient positioning system 134 receives commands to move the patient to the desired position for the scan.

The gradient waveforms produced by the pulse generator module 121 are applied to a gradient amplifier system 127 comprised of $G_x$, $G_y$ and $G_z$ amplifiers. Each gradient amplifier excites a corresponding gradient coil in an assembly generally designated 139 to produce the magnetic field gradients used for position encoding acquired signals. The gradient coil assembly 139 forms part of a magnet assembly 141 which includes a polarizing magnet 140 and a whole-body RF coil 152. A transceiver module 150 in the system control 122 produces pulses which are amplified by an RF amplifier 151 and coupled to the RF coil 152 by a transmit/receive switch 154. The resulting signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate RF coil (for example, a head coil or surface coil) to be used in either the transmit or receive mode.

The NMR signals picked up by the RF coil 152 are digitized by the transceiver module 150 and transferred to a memory module 160 in the system control 122. When the scan is completed and an entire array of data has been acquired in the memory module 160, an array processor 161 operates to Fourier transform the data into an array of image data. This image data is conveyed through the serial link 115 to the computer system 107 where it is stored in the disk memory 111. In response to commands received from the operator console 100, this image data may be archived on the tape drive 112, or it may be further processed by the image processor 106 and conveyed to the operator console 100 and presented on the display 104. For a more detailed description of the transceiver 150, reference is made to U.S. Pat. Nos. 4,952,877 and 4,992,736 which are incorporated herein by reference.

The present invention is implemented by software run either on the computer system 107 or a separate work station. There are two parts to this software: a training module which receives images acquired by the MRI system and builds a database which characterizes images acquired from different tissues and at different scan prescriptions; and a transformation module which receives an image acquired by the MRI system at a specified scan prescription and uses the stored database to produce images at other scan prescriptions.

Figure 3:
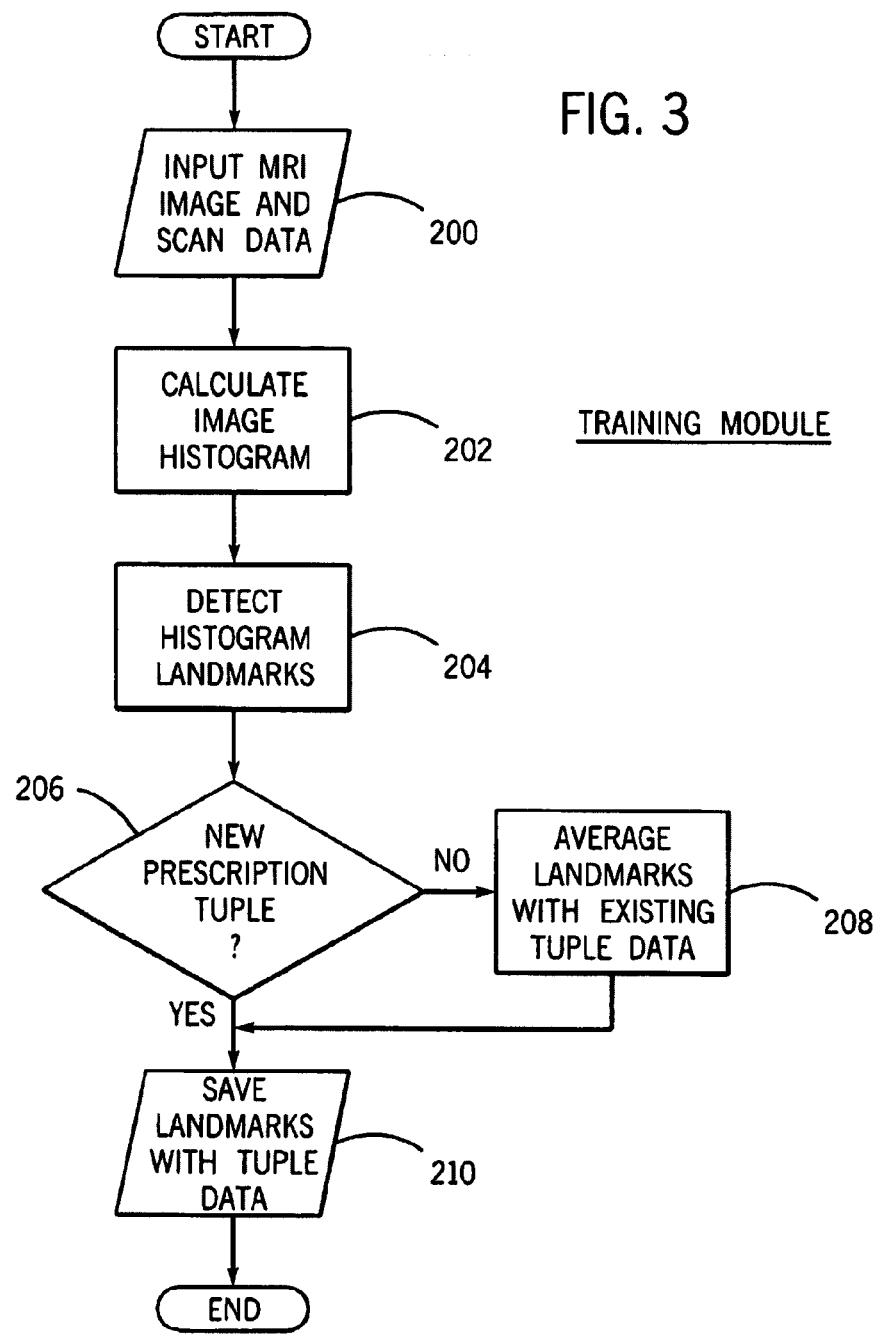
FIG. 3 is a flow chart of the training module of the present invention.

Referring particularly to FIG. 3, the training module receives MRI images at 200 along with the associated scan data. In the preferred embodiment, the scan data includes the TE and TR scan parameters of the pulse sequence used to acquire the image as well as the specific anatomy, or body part, which is the subject of the image. These scan parameters and the body-part-identifier that accompany the image are referred to hereinafter as the "scan tuple". It can be appreciated that while scan parameters TE and TR are employed in the preferred embodiment described here, other scan parameters that affect image contrast such as excitation pulse flip angle and inversion recovery time may also be employed.

The next step indicated at process block 202 is to calculate the histogram of the image. As shown for example in FIG. 5, a histogram is a count of the number of image pixels in the image at each possible image intensity level. It is a discovery of the present invention that the histogram of an image has features, or "landmarks" that are present in all MR images of a particular body part. However, these landmarks will shift along the intensity axis as a function of scan parameters TE and TR. Producing a histogram of the image is a preferred method for identifying such landmarks and locating them in an image.

Figures 5, 6:
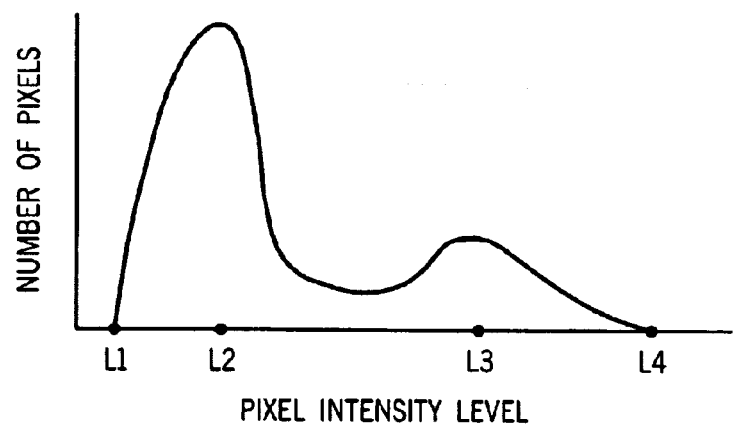
FIG. 5 is a graphic representation of an example image histogram.
FIG. 6 is a pictorial representation of a database used by the modules of FIGS. 3 and 4.

As indicated by process block 204, the next step is to detect histogram landmarks in the acquired image. There are a number of ways to do this as will be described in more detail below depending on the landmarks that are established. Suffice to say that for a given body part image, landmark intensity levels are established according to a pre-established criteria and those landmarks are detected in subsequent images. In FIG. 5, for example, the landmark criteria may establish the intensity level of the darkest pixel in the image as landmark L1, the intensity level of a first peak in the histogram may be established as landmark L2, the intensity level of a second peak in the histogram may be established as landmark L3, and the intensity level of the brightest pixel may be established as L4. The detection of these particular landmarks L1–L4 is, therefore, an analysis of the shape of the histogram to detect these points on the curve. This shape-based landmark criteria is not the currently preferred approach, but is one of the alternatives. The preferred approach is described below.

The purpose of the training module is to build a database which stores the landmark information for a wide variety of body parts and scan prescriptions. As indicated at decision block 206, if the current image is not the first image at this scan tuple the detected landmark intensities (e.g., L1–L4) are averaged with the landmark intensities detected in all previous images acquired with the same scan tuple as indicated at process block 208:

$$L_i^{updated} = \frac{L_i^1 + L_i^2 + L_i^3 \ldots + L_i^{new}}{N}, i = 1, 2, \ldots n$$

where N-1 is the total number of images used to form the already existing information record in the database with the same scan tuple as that of the image being trained. The number n is the number of landmarks stored in the database record for a specific scan tuple.

The new average landmark values are then stored in a data base 220 with their prescription scan tuple data as indicated by output block 210. Where different landmark criteria are employed to produce the data base 220, this information is also stored in database 220. For example, there may be a different landmark criteria stored for each different body part.

The training module thus produces a database 220 that contains average landmark values for each prescription tuple that has been "trained". This database 220 is depicted pictorially in FIG. 6 and its size will, of course, be determined by the number of different prescription tuples that have been trained. As further training images are received and processed as described above, additional prescription tuples and associated landmarks are added to the database 220 or the average landmark intensity levels of existing scan tuples are further refined.

As will now be described, this database 220 is also employed by the transformation module to produce additional MR images from a single acquired MR image. In this situation information stored in the database 220 is employed to produce a transformation function that enables the intensity level of pixels in the acquired MR image to be change to produce one or more new images. This transformation module may be employed in number of different clinical applications. These include: a prescan application in which the additional images assist in prescribing a subsequent image acquisition; a real-time application in which images are acquired quickly with a short TR and then simulated are produced and long TR images are displayed in near real-time; and post processing applications where additional images are produced to assist in diagnosis. The transformation module and database 220 may thus reside on the same system as the training module or an entirely different system. In the latter case, copies of the database 220 would reside on both systems and require periodic updating as further training occurs.

Figure 4:
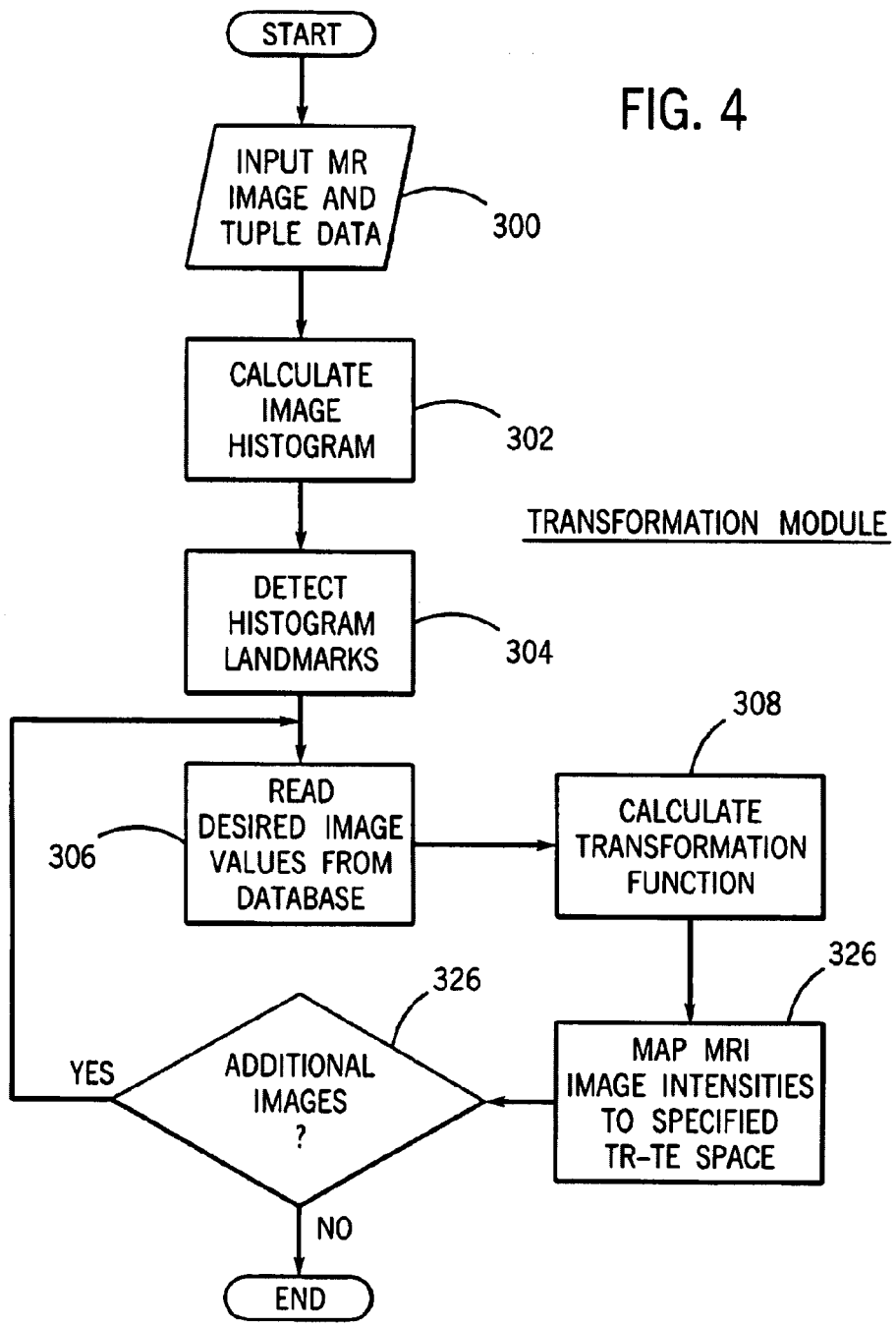
FIG. 4 is a flow chart of the transformation module of the present invention.

Referring particularly to FIG. 4, the "acquired" MR image to be transformed is input at 300 along with scan tuple data that indicates the body part in the image and the scan prescription parameters used to acquire the image. The first step is to calculate the image histogram as indicated at process block 302. This is the same as step 202 described above in the training module. As indicated by process block 304, the next step is to detect the histogram landmarks, and as described above for step 204 in the training module, the manner in which this is done will depend on the particular landmark criteria that has been established for this particular tuple data. In any case, the method used to detect histogram landmarks in the transformation module is substantially the same as that used in the training module for the same scan tuple data. A preferred method for doing this is described in detail below.

As indicated at process block 306, the next step is to find and read the landmark intensity values from database 220 corresponding to the "desired" image. The scan tuple data is used to do this by first locating the data corresponding to the imaged body part and then locating in database 220 the scan prescription parameters (TE and TR) corresponding to the desired image.

Using the retrieved landmark intensity values read from the database 220 a transformation function is calculated as indicated at process block 308. This calculation is basically an interpolation process and is best explained by reference to FIG. 8 which depicts the exemplary landmark criteria discussed above with landmarks L1–L4. More specifically, the transformation function is a set of desired image intensity values indicated by dotted line 310 which correspond to the intensity values in the acquired image. This transformation function is determined by mapping each landmark intensity value L1–L4 in the acquired image to the corresponding landmark intensity value L1–L4 in the desired image to establish the four points 312, 314, 316 and 318 on the line 310. The desired image intensity values between the points 312, 314, 316 and 318 are then determined by linearly interpolating between two of the points. The result is a set of desired image intensity levels that correspond with the set of intensity levels in the acquired image. This is stored as a one-dimensional array.

Figure 8:
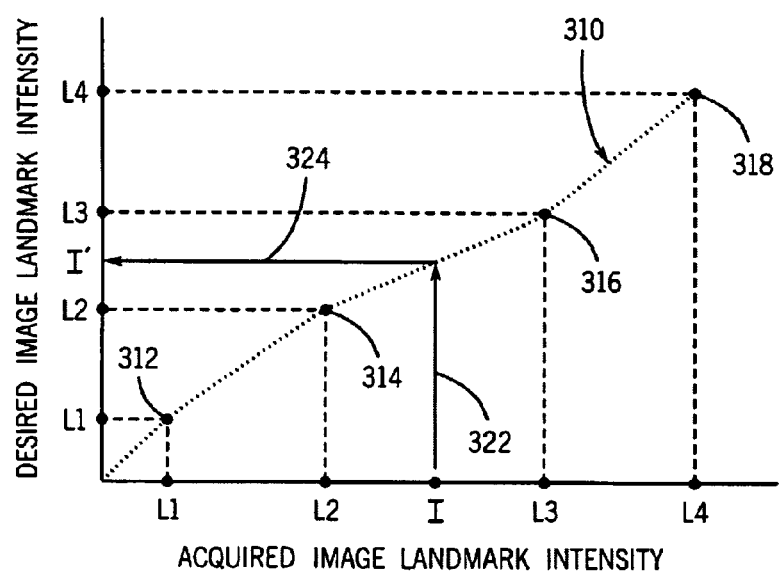
FIG. 8 is a graphic representation of a transfer function produced by the module of FIG. 4.

Referring again to FIG. 4, after the transformation function/array is calculated, it is used to produce the desired image as indicated at process block 320. This is a straight forward mapping operation in which the intensity of each acquired image pixel is changed to the corresponding intensity indicated by the transformation function/array. This mapping is depicted in FIG. 8 by the arrows 322 and 324 for an acquired pixel having an intensity I that is transformed to intensity I'. This mapping operation is performed for each pixel in the acquired image to produce a transformed intensity for the corresponding pixel in the desired image.

Additional desired images may be produced as determined at decision block 326. For example, a set of desired images at different TR and TE settings may be produced by looping back to process block 306 to read out the information in database 220 at the corresponding scan tuple values and repeating the transformation and mapping operations as described above.

Figure 9:
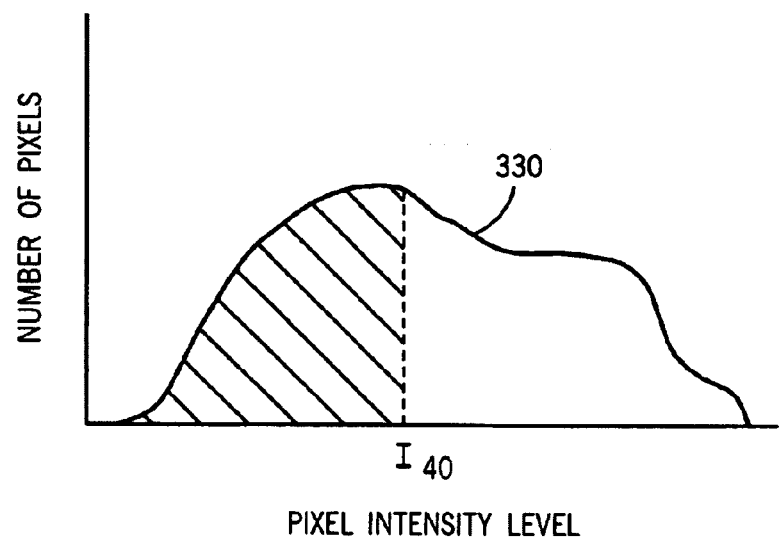
FIG. 9 is a graphic representation of an exemplary image histogram illustrating a percentile landmark used in the process of FIG. 10.

As indicated above, many different landmark criteria are possible depending, for example, on the body part being imaged. In the preferred embodiment of the invention the landmarks are established as a percentile of the image pixels that have an intensity at or below a certain level. For example, a 40 percentile landmark is the intensity level in an image at which 40% of the image pixels are at or below that intensity level. This is shown in FIG. 9 where the intensity level $I_{40}$ is the brightness at which or below which 40% of the area under histogram curve 330 lies. Rather than picking landmarks based on the shape of the histogram, therefore, landmarks based on percentiles may be used and is preferred.

Since the inter-tissue intensity profile is not as well characterized as intra-tissue intensities, the choice of percentiles is not crucial. We pick nine landmarks uniform across range at 10, 20, 30, . . . 90 percentiles. This does not and should not preclude more specific criteria in choosing the number and value of percentiles, e.g., for well-established standard calibrated images with consistent intensity values across scanners and tissues, such as is the case with some CT images. Currently no equivalent holds for MR images. The MR image histogram could potentially be inspected (even analytically) for generalized tissue compartments, and percentiles selected accordingly, but again such specificity is not sharp nor consistent across scanners accordingly, but again such specificity is not sharp nor consistent across scanners and protocols. Most importantly, it is not critical to the performance of the method.

Figure 10:
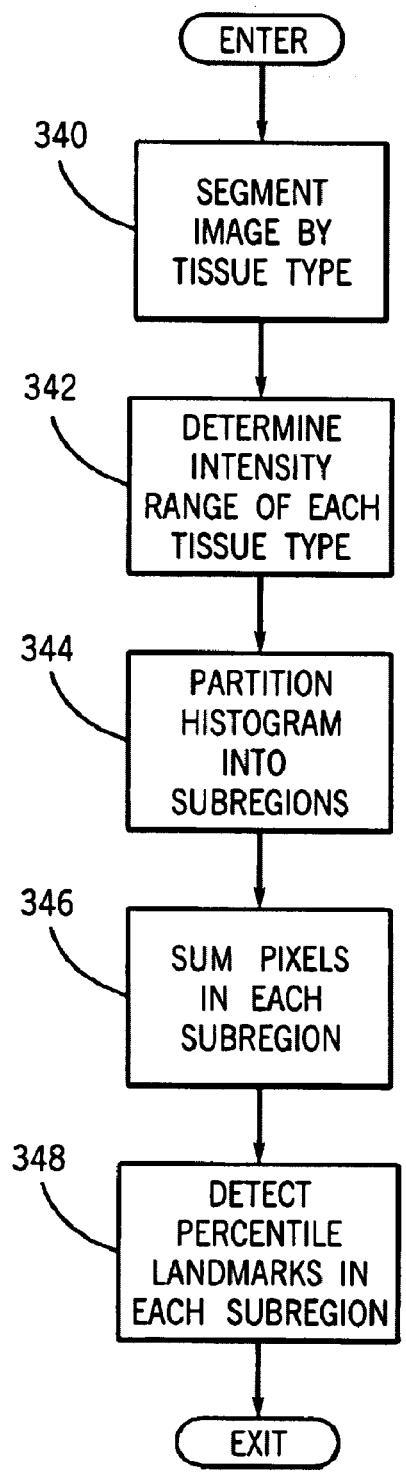
FIG. 10 is a flow chart of a preferred method for detecting landmarks in an image histogram.

Another aspect of the present invention which adds integrity to the process and which can be performed automatically is a landmark criteria which not only segments the data base 220 according to imaged body parts, but also segments according to tissue type. That is, within an image of a particular body part (e.g., head) there are different types of tissues (e.g., white matter, gray matter, . . . ). In this embodiment of the invention the process of detecting histogram landmarks in steps 204 and 304 described above is more complex as illustrated by the flow chart in FIG. 10.

The first step in this enhanced landmark detection method is to segment a copy of the acquired MR image as indicated at process block 340. There are numerous tissue segmentation methods known in the art and the particular method used will depend on the tissue types being segmented. More sophisticated segmentations such as that disclosed in by Richard A. Robb *Biomedical Imaging, Visualization, And Analysis*, Wiley-Liss. 2000 may be used or simpler methods such as the multi-level thresholding method disclosed by Srinivasan R, Yaszemski M J, Robb R A in "Evaluation Of Thresholding Techniques For Segmenting Scaffold Images In Tissue Engineering" In Proc. Sonka M, Fitzpatrick J M, eds. Medical Imaging 2004: Proc SPIE 2004, 1456 65 may be used. Regardless of the method used, each image pixel is segmented and is associated with a particular tissue type.

Figure 7:
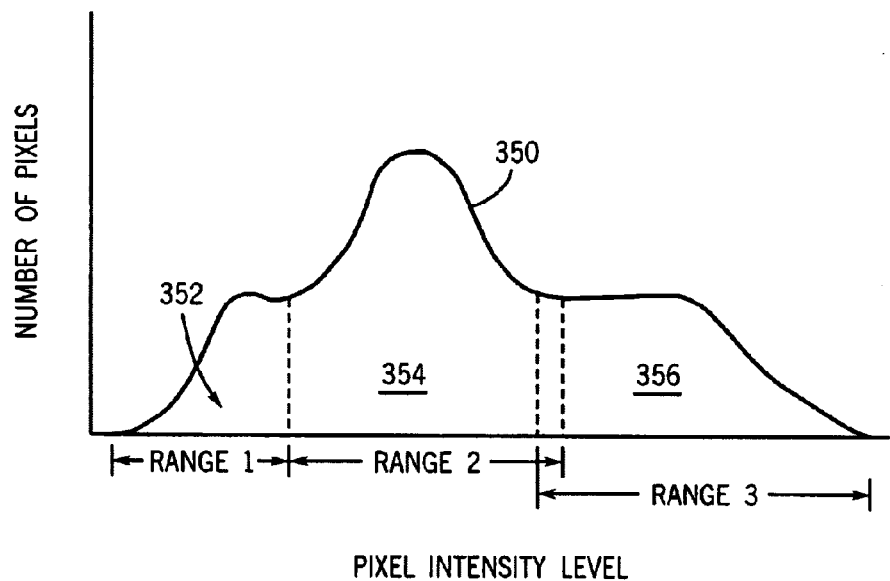
FIG. 7 is a graphic representation of an example image histogram illustrating steps in the process of FIG. 10.

The next step as indicated by process block 324 is to determine the intensity range of pixels in each tissue segment. This is simply a matter of finding the least intense pixel value $I_{min}$ in the tissue segment and the most intense pixel value $I_{max}$. Ideally the intensity ranges of each tissue type do not overlap with each other, although a moderate amount of overlap can be tolerated. Using the tissue intensity ranges the histogram of the entire image is then partitioned into sub-regions as indicated at process block 344. As shown in FIG. 7, the histogram curve 350 for the acquired MR image is divided into sub-regions corresponding to the segmented tissue type intensity ranges. In the example displayed in FIG. 7 there are three tissue types in the image extending over three intensity ranges, and hence, there are three sub-regions 352, 354 and 356 under the histogram curve 350. As indicated by process block 356 in FIG. 10, the next step is to sum the number of pixels in each sub-region so that separate percentile landmarks can be calculated for each sub-region. As indicated by process block 348, the final step is to detect percentile landmarks in each sub-region. This process is the same as that described above except instead of calculating the percentile intensity levels using the entire histogram, the percentile intensity levels are determined for each sub-region. The result is a series of landmark intensity levels for storage in database 220 or averaging with data already in the database 220 as described above.

Figure 11C:
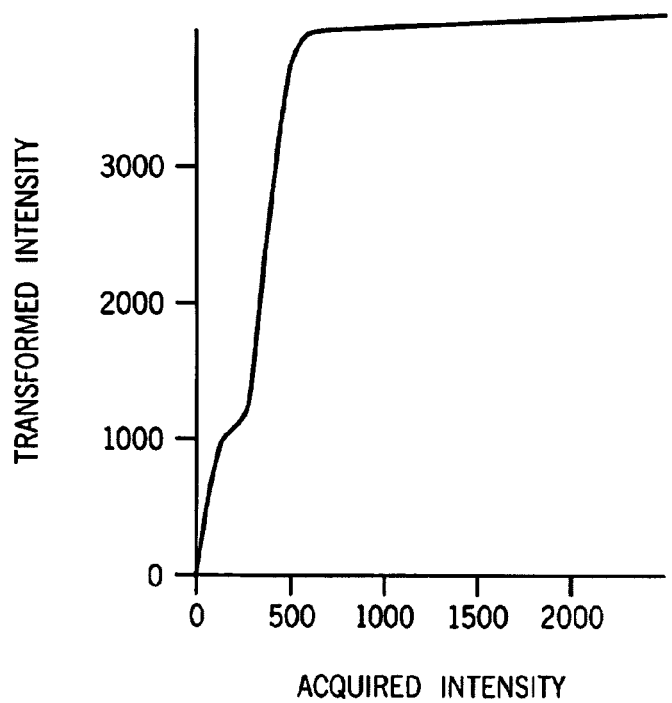
FIG. 11C is a transformation curve used to perform the tranformation on the image of FIG. 11A.
Figure 11A:
FIG. 11A is an exemplary image acquired from a subject.
Figure 11B:
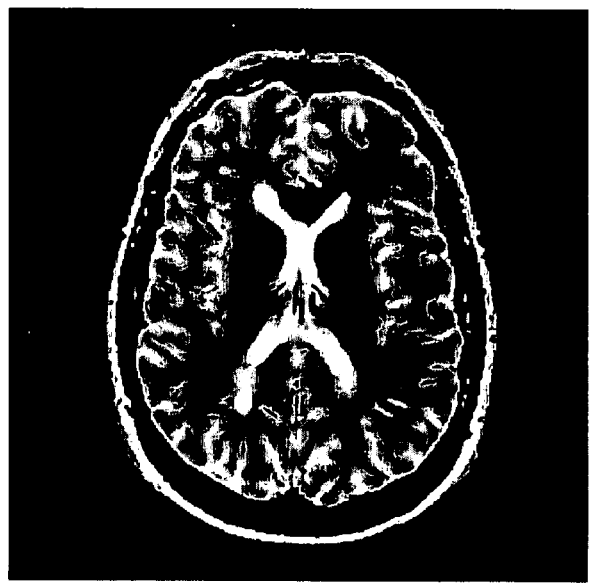
FIG. 11B is the same image after transformation according to the present invention.

The present invention may be used in a number of different clinical applications. The invention may be used for example in a workstation used by a radiologist to study an acquired MR image for diagnostic purposes. While the prescribed image may depict certain tissues and tissue boundaries well, it may be less than optimal for others. Rather than rescan the patient, the radiologist employs the transformation module and database 220 described above to produce one or more transformed images that simulate MR images acquired at different scan prescriptions. An example of such a study is shown in FIG. 11, where a representative transverse section on an MR image of a patient with severe MS lesions. The original image in FIG. 11A was acquired at (TR, TE)=2200, 80 msec. The image in FIG. 11B is obtained by transforming the original image to a (TR, TE) space of (3700, 160 msec). The corresponding non-linear transformation curve is shown in FIG. 11C. As can be clearly seen, the transformation markedly improves the relative contrast between the white and grey matter and CSF at the macro level and the individual anatomical structures (ventricle, caudata, putamen, etc.) at the micro level.

Another clinical application of the present invention is interventional MR imaging. When MRI is employed to monitor or guide a medical procedure there is a premium placed on producing images quickly to provide real-time information. MRI is used in such procedures because it has the unique ability to distinguish between certain tissue types. However, optimal tissue differentiation often requires that a long TR be prescribed for the acquisition in order to enhance $T_2$ contrast. The long TR translates to long scan time for each image which is unsatisfactory in interventional MRI.

In this application the translation module and database 220 are coupled to receive images as they are produced by the MRI system and the translation module produces transformed images for the physician immediately. This enables the scan parameters to be set with the shortest possible TR such that MR images are acquired at a fast rate. However, the present invention produces corresponding transformed images which simulate $T_2$ contrast enhanced images that provide optimal diagnostic information in near real-time to the physician. In other words, the physician receives long TR images without paying a penalty in scan time.

In yet another clinical application a scout scan may be performed prior to a complete MRI scan in order to determine the optimal scan prescription. Scout scans are acquired with fewer views and typically contain image artifacts which hinder diagnostics. However, they are acquired very quickly and are practical to acquire prior to certain scans. Rather than acquire a series of such scout scans at a corresponding number of different scan prescriptions, the present invention enables the procedure to be shortened. More specifically, a single scout MR image is acquired and the transformation module and database 220 are employed to produce any number of transformed scout images that simulate scout images acquired at different scan prescriptions. The radiologist can thus try different scan prescriptions to see immediately which is most likely to provide the desired diagnostic information in a subsequent complete MRI acquisition. That optimal scan is then performed.

The invention claimed is:

1. A method for producing magnetic resonance images during a medical procedure, the steps comprising:
    a) acquiring image data with a magnetic resonance imaging system using a pulse sequence with a short TR that enables the prompt acquisition of an image data set;
    b) reconstructing an image with the acquired image data set;
    c) transforming the intensities of pixels in the reconstructed image to produce a transformed image that simulates an image reconstructed from image data acquired with a pulse sequence having a TR substantially longer than that used in step a);
    d) displaying the transformed image; and
    e) repeating steps a) through d) throughout the medical procedure to continuously update the displayed transformed image.

2. The method as recited in claim 1 in which the transformation in step c) includes:
    i) producing a histogram of the reconstructed image;
    ii) detecting landmarks in the histogram;
    iii) calculating a transformation function using the detected landmarks and landmarks stored in a database for a selected longer TR; and
    iv) mapping the intensity of pixels in the reconstructed image using the transformation function to produce corresponding pixels in the transformed image.

3. The method as recited in claim 2 in which step c) also includes:
    v) segmenting the reconstructed image according to tissue type;
    vi) establishing pixel intensity ranges for the respective tissue segments; and
    vii) using the intensity ranges in performing step ii).

4. A method for producing a magnetic resonance image of an object in a subject, the steps comprising:
    a) acquiring magnetic resonance image data from the object in the subject with a magnetic resonance imaging system that employs a pulse sequence having prescribed scan parameters related to a prescribed image contrast;
    b) reconstructing an image with the acquired magnetic resonance image data;
    c) transforming the intensities of pixels in the reconstructed image to produce a transformed image that simulates an image reconstructed from magnetic resonance image data acquired with a pulse sequence having different prescribed scan parameters related to a different prescribed image contrast; and
    d) displaying the transformed image.

5. The method as recited in claim 4 in which steps c) and d) are repeated to produce and display a plurality of different transformed images that simulate a corresponding plurality of different images reconstructed from magnetic resonance image data acquired with pulse sequences having corresponding different prescribed scan parameters.

6. The method as recited in claim 4 in which the transformation in step c) includes:
    i) producing a histogram of the reconstructed image;
    ii) detecting landmarks in the histogram;
    iii) calculating a transformation function using the detected landmarks and landmarks stored in a database for said different prescribed scan parameters; and
    iv) mapping the intensity of pixels in the reconstructed image using the transformation function to produce corresponding pixels in the transformed image.

7. The method as recited in claim 6 in which step c) also includes:
    v) segmenting the reconstructed image according to tissue type;
    vi) establishing pixel intensity ranges for the respective tissue segments; and
    vii) using the intensity ranges in performing step ii).

8. The method as recited in claim 4 in which the prescribed scan parameters include echo time TE and transmit repeat time TR.

9. A method for producing an image with a magnetic resonance imaging (MRI) system, the steps comprising:
    a) performing a scout scan with the MRI system to acquire image data using a pulse sequence with prescribed scan parameters;

b) reconstructing a scout image with the acquired image data;

c) transforming the intensities of pixels in the scout image to produce a plurality of transformed scout images that simulate scout images reconstructed from image data acquired with pulse sequences having different scan parameters; and d) displaying the transformed scout images to enable a user to examine them and to select scan parameters for a subsequent image acquisition with the MRI system.

10. The method as recited in claim 9 in which the transformation in step c) includes:

i) producing a histogram of the scout image;

ii) detecting landmarks in the histogram iii) calculating a plurality of transformation functions using the detected landmarks and landmarks stored in a database for each of the different scan parameters; and iv) mapping the intensity of pixels in the scout image using each of the plurality of transformation functions to produce corresponding pixels in each of the corresponding transformed scout images.

11. The method as recited in claim 10 in which step c) also includes:

v) segmenting the reconstructed image according to tissue type;

vi) establishing pixel intensity ranges for the respective tissue segments; and vii) using the intensity ranges in performing step ii).

12. The method as recited in claim 9 in which the scan parameters includes echo time TE and transmit repeat time TR.

* * * * *